United States Patent
Yi et al.

(10) Patent No.: US 6,479,346 B1
(45) Date of Patent: Nov. 12, 2002

(54) SEMICONDUCTOR MEMORY DEVICE AND FABRICATION METHOD THEREOF

(75) Inventors: Sang-Bai Yi, Cheongju (KR); Jae-Min Yu, Cheongju (KR); Sung-Chul Lee, Cheongju (KR)

(73) Assignee: LG Semicon Co., Ltd., Choongcheongbuk-Do (KR)

( * ) Notice: Subject to any disclaimer, the term of this patent is extended or adjusted under 35 U.S.C. 154(b) by 0 days.

(21) Appl. No.: 09/544,214

(22) Filed: Apr. 7, 2000

(30) Foreign Application Priority Data

May 10, 1999 (KR) .............................................. 99/16622

(51) Int. Cl.[7] .............................................. H01L 21/336

(52) U.S. Cl. ...................... 438/257; 438/243; 438/386; 438/392

(58) Field of Search ................................. 438/243, 257, 438/386, 392

(56) References Cited

U.S. PATENT DOCUMENTS

| 5,534,455 A | | 7/1996 | Liu | |
|---|---|---|---|---|
| 6,025,224 A | * | 2/2000 | Gall et al. | 438/243 |
| 6,069,384 A | * | 5/2000 | Hause et al. | 257/330 |

* cited by examiner

Primary Examiner—David Nelms
Assistant Examiner—Reneé R. Berry
(74) Attorney, Agent, or Firm—Birch, Stewart, Kolasch & Birch, LLP

(57) ABSTRACT

In a semiconductor memory device including memory cells and a peripheral circuit unit, a memory cell has a first gate structure formed on a semiconductor substrate; a first impurity region of a first conductive type formed in the substrate on a first side of the gate structure; and a second impurity region formed in the substrate on a second side of the gate structure, the second impurity region including: a third impurity region of the first conductive type, a fourth impurity region of the first conductive type between the third impurity region and the second side of the gate structure, and a halo ion region of a second conductive type formed adjacent to the fourth impurity region.

10 Claims, 8 Drawing Sheets

SEMICONDUCTOR MEMORY DEVICE AND FABRICATION METHOD THEREOF

BACKGROUND OF THE INVENTION

1. Field of the Invention

The present invention relates to a semiconductor memory device, and in particular to a flash electrically erasable programmable read only memory (flash EEPROM) device and a fabrication method thereof.

2. Description of the Background Art

FIG. 1 illustrates a cell layout of a conventional semiconductor memory device.

A plurality of field oxide films 101 are formed on a semiconductor substrate 100. The field oxide films 101 correspond to non-active regions or device isolation regions. The regions except for the field oxide films 101 are active regions 102. A plurality of floating gates FG are formed vertically to the active regions 102. An insulation film (not shown) is positioned on the floating gate FG, and a control gate CG is formed in an identical direction to the floating gate FG. In addition, a source 103 and a drain 104 are respectively formed on the active regions 202 at both sides of the floating gate FG. A contact hole 105 for connecting a bit line BL to the drain region 104 is formed at a predetermined region of the drain 104. The bit line BL is positioned crossing the control gate CG, and connected to the drain 104 via the contact hole 105. Referring to FIG. 1, a dotted-lined inner structure provided with reference numeral 110 depicts a unit cell of a flash electrically erasable programmable read only memory (flash EEPROM).

FIG. 2 is a vertical-sectional view taken along Line II—II in FIG. 1, illustrating a unit cell of an ETOX (EPROM with Tunnel Oxide) type flash EEPROM. As shown therein, a tunnel oxide film 201 which is a gate oxide film of a floating gate is formed on a semiconductor substrate 200. A floating gate electrode 202 consisting of polysilicon, an interpoly dielectric film 203 and a control gate electrode 204 are sequentially stacked on the tunnel oxide film 201. A source 205 and a drain 206 are formed in the semiconductor substrate 200 at both sides of the floating gate electrode 202. The source 205 includes a first source layer 205a (n+ layer) which is relatively highly doped, and a second source layer 205b (n− source) which is a relatively lightly doped. Such a source is called a graded junction source. The drain 206 is a highly-doped layer (n+ layer), identical to the first source 205a. The reason why the conventional flash EEPROM device employs the above asymmetric structure of the source (n−/n+ structure) and the drain (p+/n+ structure) will now be described.

During a programming operation of the flash EEPROM, a high voltage of 8V is applied to the drain, and a high voltage of 12V is applied to the gate electrode. A hot electron, generated in the drain, passes through the tunnel oxide film, and enters the floating gate. Accordingly, generation of the hot electron is facilitated by forming an abrupt junction of n+/p+ between the drain and substrate, thereby improving programming speed. In addition, a high voltage (over 10V) is applied to the source during an erase operation, thereby emitting the hot electron from the floating gate to the source. Here, in order for the source junction to endure the latter high voltage, a doping concentration of the n-type source is slowly decreased. The above-described flash memory cell has a disadvantage in that the cell's area is increased due to lateral diffusion of the source.

Accordingly, a method of applying a negative voltage to the gate electrode and applying a voltage below 5V to the source is conventionally practiced in order to restrict increase of the cell area resulting from the lateral diffusion and to improve reliability of the source junction. The flash memory of the aforementioned structure does not require a deep and slow junction structure (graded junction structure) like the ETOX memory as shown in FIG. 1. Therefore, the increase of the cell area resulting from the lateral diffusion of the source can be restricted. However, an overlap between the floating gate and the source region is necessary during the erase operation. In addition, the doping concentration of the source region must be sufficiently high to prevent a voltage drop by the source voltage during the program operation. For example, when the source is formed, the doping is below $2*10^{15}$ atom/cm$^2$, a depletion layer is formed at an overlapping region with the floating gate. This results in tunneling, thereby sharply decreasing gate current. As a result, although the modified source structure does not require the graded junction structure, an asymmetric structure is formed where the source and drain have different doping concentrations.

Referring to FIG. 3A, a device isolation region 301, namely a field oxide film 301 is formed on a semiconductor substrate 300 according to a wellknown partial silicon oxidation process. The regions, except for the field oxide films 301 are active regions 301, and the regions of the field oxide films 302 are non-active regions. Here, the field oxide film is shown merely at the right side of FIG. 3A because the left side thereof illustrates the vertical-sectional view taken along Line IIIe—IIIe in FIG. 1.

As illustrated in FIG. 3A, a tunneling oxide film 303 is formed at a predetermined region of the semiconductor substrate 300 where a flash memory cell unit will be formed. Thereafter, a first polysilicon layer is formed on the tunneling oxide film 303, and patterned in order to remain merely at the active region 302, thereby forming a first polysilicon layer pattern 304. An interpoly dielectric film 305 consisting of an oxide film/nitride film/oxide film structure (hereinafter, referred to as 'ONO film') is formed on the resultant structure of the semiconductor substrate 300. The ONO film 305 serves to insulate the floating gate and the control gate, and becomes a gate insulation film of the control gate to be formed in a succeeding process. As shown at the right side of FIG. 3A, the ONO film 305 on the semiconductor substrate of the peripheral circuit unit is removed.

Then, a cleansing process is carried out. As illustrated at the right side of FIG. 3B, the entire surface of the semiconductor substrate is thermally oxidized, thereby forming a gate oxide film 306 on the semiconductor substrate 300 of the peripheral circuit unit.

As depicted in FIG. 3B, a second polysilicon layer is formed on the entire surface of the semiconductor substrate 300. The second polysilicon layer, the ONO film 305 and the first polysilicon layer pattern 304 are etched by using a known stack gate etching process, thereby forming a second polysilicon layer pattern 307a, namely a control gate electrode 307a, and a floating gate electrode 304a which is self aligned with the control gate electrode 307a, patterned, and positioned therebelow. The floating gate electrode 304a is formed by patterning the first polysilicon layer pattern 304 according to the stack gate etching process. Here, referring to the right side of FIG. 3B, a gate electrode 307b is also formed by patterning the second polysilicon layer.

As shown at the right side of FIG. 3C, a first ion implantation mask 320 is formed on the semiconductor substrate of the peripheral circuit unit. As depicted at the left side of FIG. 3C, ions are implanted in order to form a source 308 and a drain 309 of the memory cell unit.

Thereafter, the first ion implantation mask 320 is removed. As shown at the left side of FIG. 3D, a second ion implantation mask 330 is formed on the semiconductor substrate of the memory cell unit, and as shown at the right side of FIG. 3D, impurity ions are implanted into the semiconductor substrate 300 at both sides of the gate electrode 307b of the peripheral circuit unit, thereby forming a lightly-doped region 310 which is called LDD.

The second ion implantation mask 330 is removed. As illustrated in FIG. 3E, sidewall spacers 311 are formed at both side walls of the floating gate electrode 304a and the control gate electrode 307a of the memory cell unit, and the gate electrode 307b of the peripheral circuit unit, respectively.

Thereafter, referring to FIG. 3F, a common source mask 340 is formed on the semiconductor substrate of the memory cell unit and the peripheral circuit unit in order to form a common source. A common source etching is performed by using the common source mask 340, in order to remove the field oxide film which electrically divides the sources of the memory cell. Impurity ions are highly doped into the common source region, thereby forming a common source 308a.

A third ion implantation mask 350 is formed on the semiconductor substrate of the memory cell unit. As shown at the right side of FIG. 3G, impurity ions are implanted into the semiconductor substrate at both sides of the sidewall spacers of the peripheral circuit unit, thereby forming a source and a drain 312. As described above, a transistor of the peripheral circuit unit of the flash memory device generally has a source/drain structure having a lightly doped drain (LDD) region. The structure is symmetric in the source and drain shape and doping concentration. On the other hand, the source/drain structure of the memory cell unit of the flash memory device is not the LDD structure. Here, the source and drain is asymmetric in concentration and structure, differently from the source/drain structure of the peripheral circuit unit. As a result, in accordance with the fabrication method of the flash memory device, after the source and drain of the cell array unit are formed, the source and drain of the peripheral circuit unit are separately formed, and thus the whole process is complicated.

SUMMARY OF THE INVENTION

It is therefore a primary object of the present invention to provide a method of fabricating a semiconductor memory device which can simplify an entire process by combining fabrication processes of sources and drains of a peripheral circuit unit and a cell array unit, namely simultaneously forming the sources and drains of the peripheral circuit unit and the cell array unit.

It is another object of the present invention to provide a semiconductor memory device and a fabrication method thereof which can improve a punch-through internal pressure by forming sources and drains of a memory cell unit and a peripheral circuit unit to have a lightly doped region, and by having a flash memory device structure forming a halo ion implantation layer around the lightly-doped region.

In order to achieve the above-described objects of the present invention, according to one embodiment a semiconductor memory device includes a first gate structure formed on a semiconductor substrate; a first impurity region of a first conductive type formed in the substrate on a first side of the gate structure; and a second impurity region formed in the substrate on a second side of the gate structure, the second impurity region including: a third impurity region of the first conductive type, a fourth impurity region of the first conductive type between the third impurity region and the second side of the gate structure, and a halo ion region of a second conductive type formed adjacent to the fourth impurity region.

In another embodiment of the invention, as broadly described, a method of fabricating a semiconductor substrate includes forming a first gate structure for a memory cell and forming a second gate structure for a peripheral circuit; forming a first region of a first conductive type in the semiconductor substrate at respective sides of the first and second gate structures; forming a second region of the first conductive type in the semiconductor substrate adjacent sides of the first region further from the first and second gate structures; and forming a halo ion region of a second conductive type, opposite the first conductive type, adjacent to sides of the first region and nearer to the first and second gate structures.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
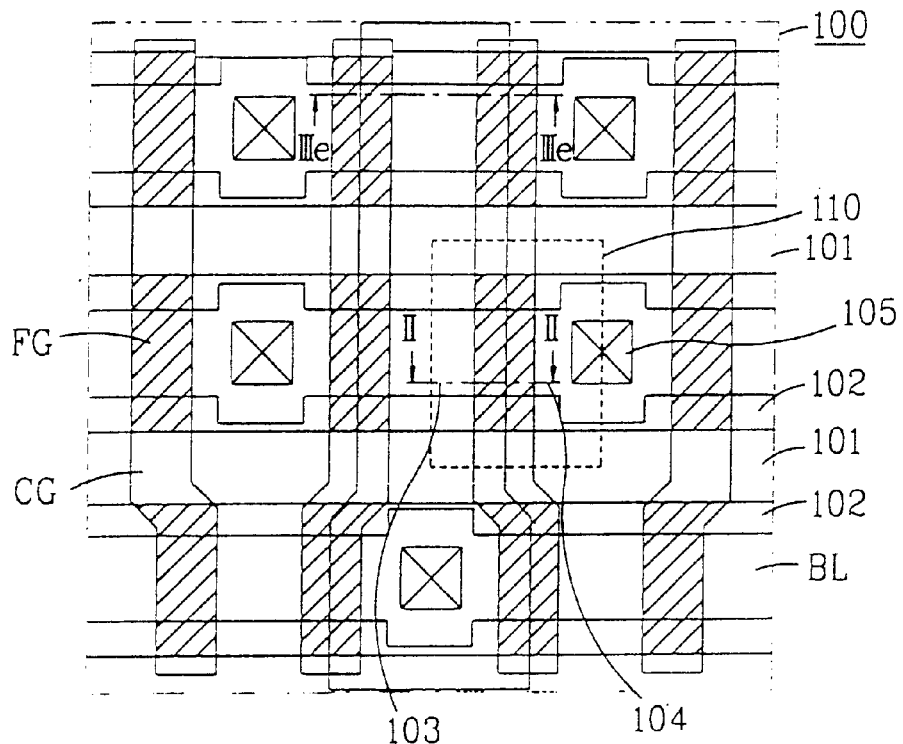
FIG. 1 is a plan view illustrating a layout of a conventional semiconductor memory device.
Figure 2:
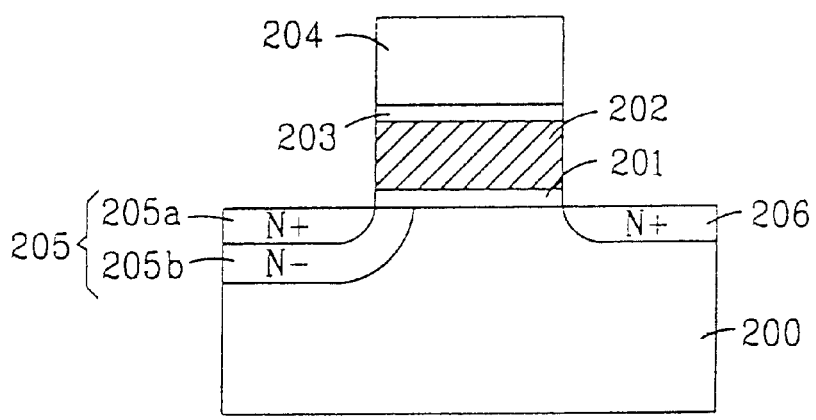
FIG. 2 is a vertical-sectional view taken along Line II—II of FIG. 1.
Figure 3A:
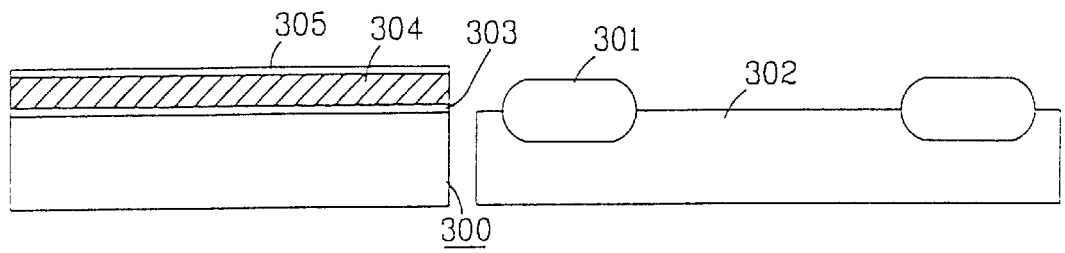
FIGS. 3A to 3G respectively illustrate sequential steps of a fabrication process of the conventional semiconductor memory device.
Figure 3B:
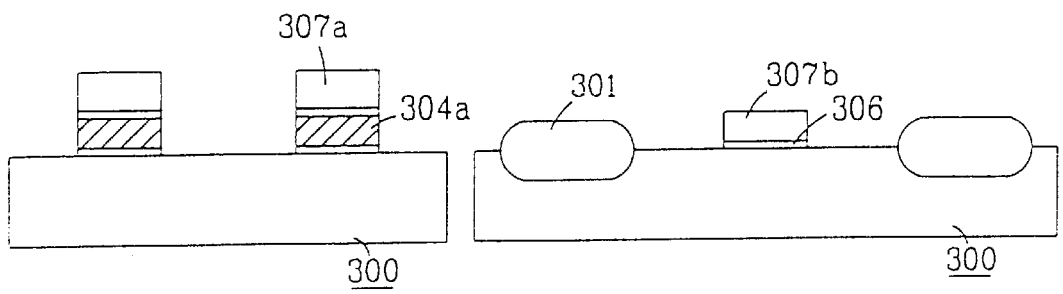
Figure 3C:
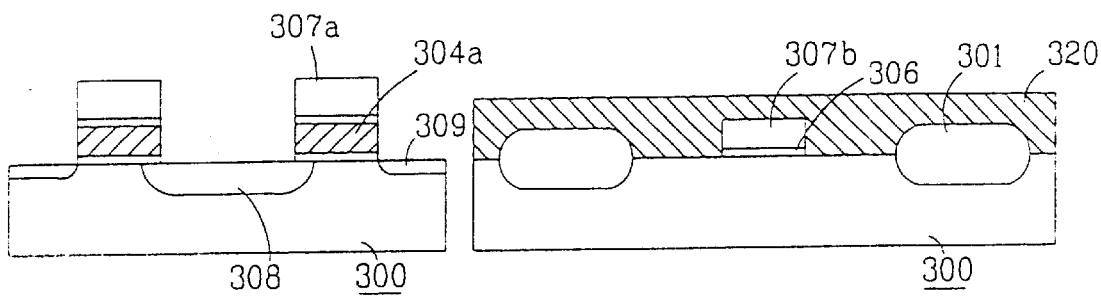
Figure 3D:
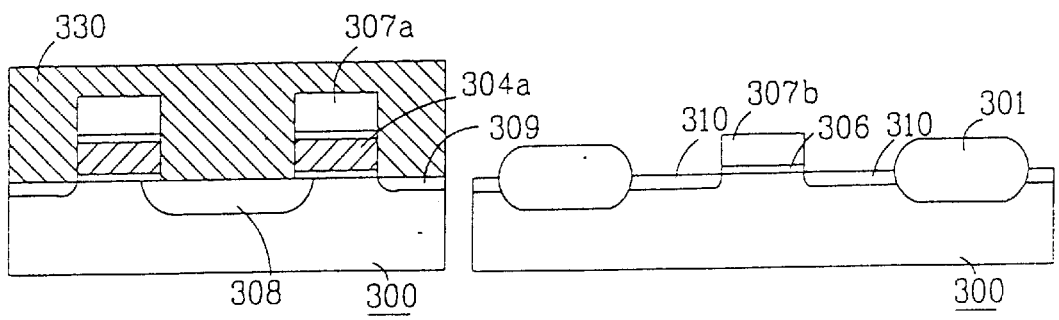
Figure 3E:
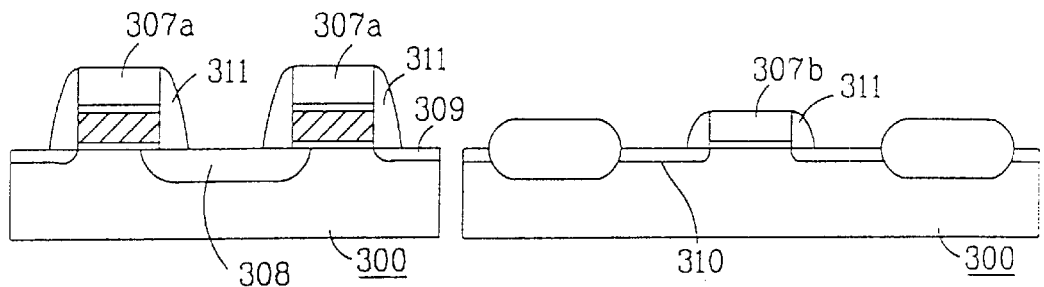
Figure 3F:
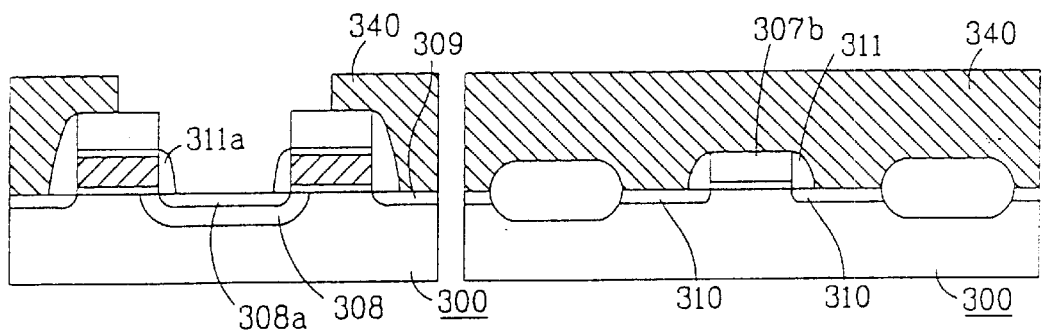
Figure 3G:
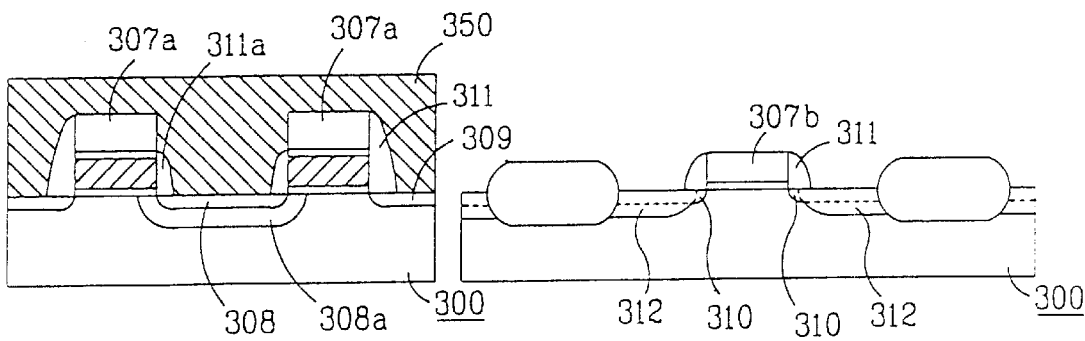
Figure 4A:
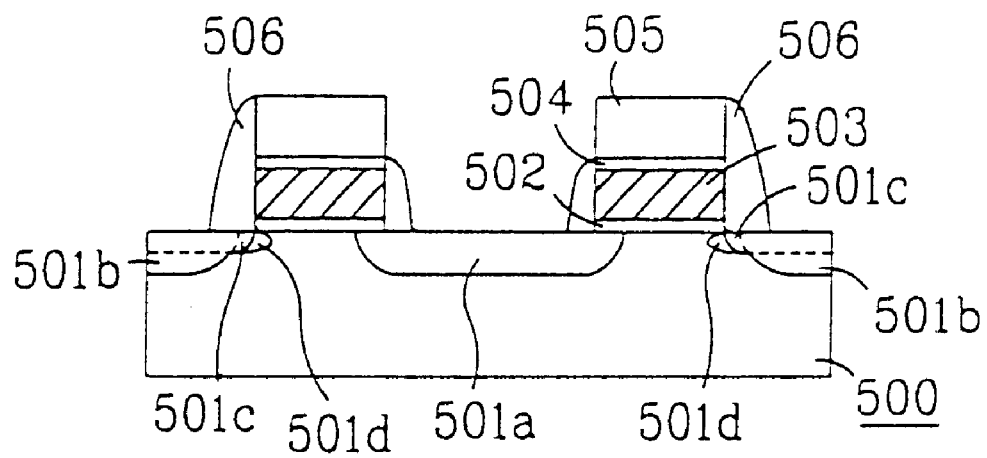
FIGS. 4A and 4B are vertical-sectional views respectively a illustrating a semiconductor device in accordance with the present invention.
Figure 4B:
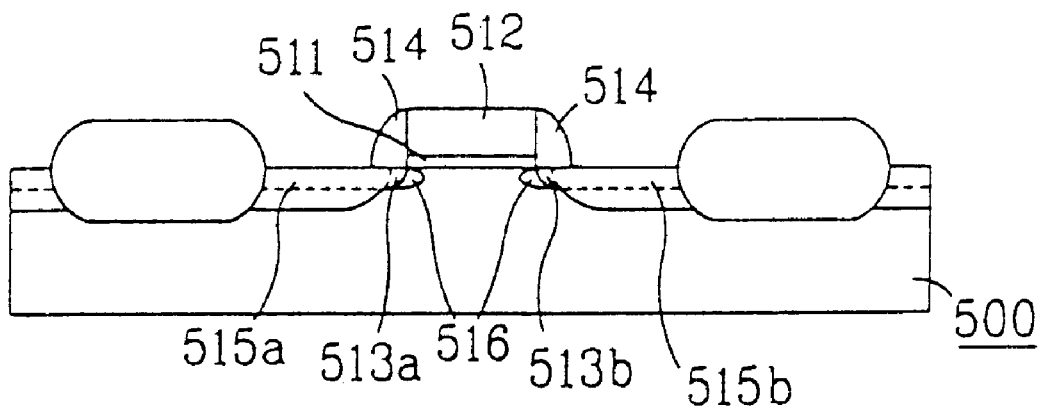

FIGS. 4A and 4B are vertical-sectional views respectively illustrating a memory cell unit and a peripheral circuit unit of a semiconductor memory device in accordance with the present invention.

A structure of the memory cell unit will now be explained with reference to FIG. 4A. A tunnel oxide film 502 consisting of a silicon oxide film is formed on a semiconductor substrate 500 corresponding to the memory cell unit. A floating gate electrode 503 is formed on the tunnel oxide film 502, and an interpoly dielectric film 504 having a structure of oxide film/nitride film/oxide film (i.e., ONO film) is formed on the floating gate electrode 503. A control gate electrode 505 is formed on the interpoly dielectric film 504. A sidewall spacer 506 is formed at one side wall of the control gate electrode 505.

Highly-doped regions 501a, 501b which are relatively highly doped are formed in the semiconductor substrate 500 at both sides of the control gate electrode 505. Ions at a concentration over $2*10^{15}$ atom/cm$^2$ are implanted into the highly-doped region 501a. The highly-doped region 501a formed in the semiconductor substrate at one side of the control gate electrode 505 is a source of the memory cell unit, and the highly-doped region 501b formed in the semiconductor substrate at the other side is a drain of the memory cell unit.

The sidewall spacers 506 are formed at side walls of the control gate electrode 505 and the floating gate electrode 503 adjacent to the drain 501b. A lightly-doped region 501c, which is more lightly doped than the highly-doped region 501b by approximately 100 times, is formed in the semiconductor substrate below the sidewall spacer 506. The lightly-doped region 501c is called a lightly-doped drain (LDD) in a general fabrication process of the semiconductor device. In addition, a halo ion implantation region 501d is formed around the lightly-doped region 501c. The highly-doped region 501b and the lightly-doped impurity region 501c include identical conductive type impurity ions. However, the halo ion implantation layer 501d includes conductivity type impurity ions opposite to the highly-doped region 501b.

The source 501a of the memory cell in accordance with the present invention does not have a graded junction structure, (different from the conventional art). In addition, the source, which is the highly-doped region, is formed to be sufficiently overlapping with the floating gate electrode.

The device of the peripheral circuit unit shown in FIG. 4B will now be described. A gate insulation film 511 is formed on the semiconductor substrate 500 of the peripheral circuit unit. A gate electrode 512 is formed on the gate insulation film 511. Lightly-doped layers 513a, 513b are formed in the semiconductor substrate 500 at both sides below the gate electrode 512. The lightly-doped layers 513a, 513b are relatively lightly doped, as compared with highly-doped layers (explained later), and serve to restrict generation of a hot carrier by preventing an electric field from being concentrated. In addition, sidewall spacers 514 are formed at both side walls of the gate electrode 512. Highly-doped layers 515a, 515b are formed in the semiconductor substrate 500 outside the sidewall spacer 514. The highly-doped layers 515a, 515b correspond to the source and drain. A halo ion implantation layer 516 having conductive type impurity ions opposite to the lightly-doped impurity ions is formed in the semiconductor substrate 500 around the lightly-doped layers 513a, 513b and below the gate electrode 512, and serves to restrict a short channel effect resulting from the punch-through phenomenon.

As described above, the flash memory device according to the present invention has the LDD region at the drain of the memory cell unit and the source and drain of the peripheral circuit unit. The halo ion implantation layer is formed around the LDD region. In addition, the source of the memory cell unit has an abrupt junction structure which is a single PN junction, not the LDD structure or graded junction structure.

The operation of the flash memory device in accordance with the present invention will now be explained. In a programming operation, the halo ion implantation layer and the drain region form the abrupt junction, and thus allow the hot carrier to be easily generated. As a result, programming operational speed is improved.

In an erase operation, a negative voltage is applied to the gate electrode, and a low voltage below 5V is applied to the source, thereby forming the source having the abrupt junction, instead of the conventional graded junction structure. That is, the flash memory device in accordance with the present invention applies a voltage (below 5V) lower than the conventional art. At a higher voltage, the source of the abrupt junction as in the present invention is easily destroyed during the erase operation. Thus, the flash memory cell structure according to the present invention is suitable for applying the negative voltage to the gate and a voltage below 5V to the source during the erase operation.

A method of fabricating the flash memory device in accordance with the present invention will now be described. FIGS. 5A to 5F illustrate sequential steps of a process of fabricating the memory cell unit at their left sides, and illustrate sequential steps of a process of fabricating the peripheral circuit unit at their right sides, respectively. In the method of fabricating the flash memory device, the memory cell unit and the peripheral circuit unit are not separately fabricated. Therefore, the fabrication process of transistors of the memory cell unit and the peripheral circuit unit will now be explained in accordance with the sequential steps of the fabrication process of the flash memory device.

Figure 5A:
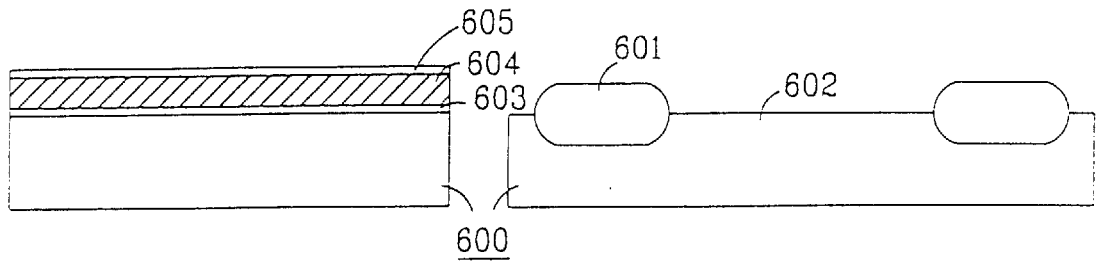
FIGS. 5A to 5F respectively illustrate sequential steps of a fabrication process of the semiconductor memory device in accordance with the present invention.

Referring to the right side of FIG. 5A, a plurality of field oxide films 601 are formed at a predetermined portion of a semiconductor substrate 600. Regions where the field oxide films 601 are not formed are active regions 602, and regions covered with the field oxide films 601 are non-active regions or device isolation regions.

As shown at the left side of FIG. 5A, a tunnel oxide film 603 is formed at an entire surface of the semiconductor substrate 600 corresponding to the memory cell unit. Thereafter, a first polysilicon layer is formed on the tunnel oxide film 603, and patterned, thereby forming a polysilicon pattern 604. An interpoly dielectric film 605 consisting of oxide film/nitride film/oxide film (hereinafter, referred to as 'ONO film') is formed at an entire surface of the resultant structure on the semiconductor substrate 600.

Figure 5B:
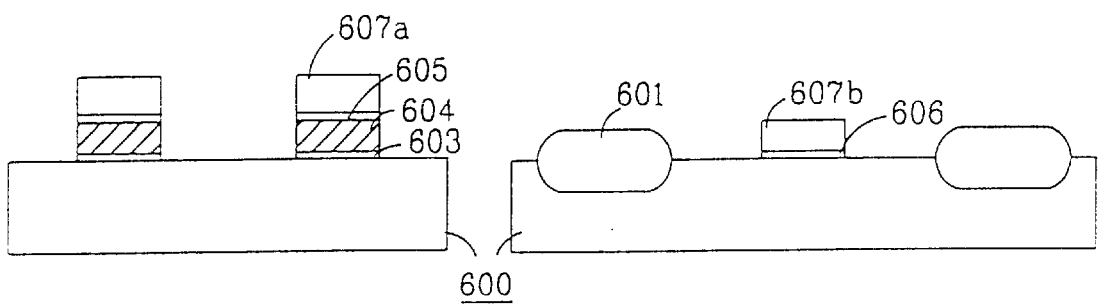

As illustrated at the right side of FIG. 5B, the ONO film 605 of the peripheral circuit unit is removed, and a gate oxide film 606 is formed thereon. The gate oxide film 606 is a silicon oxide film formed according to a thermal oxidation process.

Referring to FIG. 5B, a second polysilicon layer is formed on the ONO film 605 of the memory cell unit and the gate oxide film 606 of the peripheral circuit unit. Thereafter, the second polysilicon layer is patterned, and thus a control gate electrode 607a of the memory cell transistor is formed on the ONO film 605 of the memory cell unit, and a gate electrode 607b of the peripheral circuit unit transistor is formed on the gate oxide film 606 of the peripheral circuit unit. Here, the second polysilicon layer of the memory cell unit is patterned, thereby forming the control gate electrode 607a. Then, the polysilicon pattern 604 is etched by using the control gate electrode 607a as a self-aligned mask, thereby forming a floating gate electrode 604 consisting of polysilicon.

Figure 5C:
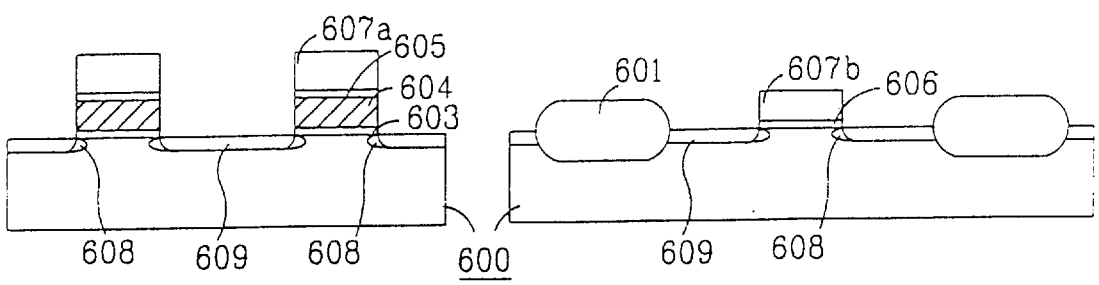

As depicted in FIG. 5C, a lightly-doped impurity layer 609 is formed by implanting first conductive type impurity ions, for example phosphorus (P) or arsenic (AS) ions, or both ions into the semiconductor substrate at both sides of the control gate electrode 607 and the gate electrode 607b, and by using as masks the control gate electrode 607a of the memory cell transistor and the gate electrode 607*b* of the peripheral circuit unit transistor. Here, the semiconductor substrate 600 is doped with second conductive type impurity ions. In case the semiconductor substrate 600 is doped with the first conductive type impurity ions such as phosphorus or arsenic ions, the lightly-doped layer 609 is formed by implanting the second conductive type ions, namely boron (B) ions. The lightly-doped layer 609 is known as a lightly doped drain (LDD) in a general fabrication process of the semiconductor device. The lightly-doped layer 609 has an identical conductive type to a highly-doped layer to be formed in a subsequent process, and is more lightly doped by approximately 100 times. Then, the second conductive ions, for example boron (B) ions are implanted into the semiconductor substrate 600 around the lightly-doped layer 609 according to a slope angle ion implantation process having a slope angle of approximately 30°. A region where the second conductive type ions are implanted is called a halo ion implantation region 608. It is preferable that the second conductive type is identical to the conductive type of the semiconductor substrate 600. The second conductive type is opposite to the first conductive type. In addition, the second conductive type ions may be implanted into a n-type or p-type well formed in the semiconductor substrate 600, instead of the semiconductor substrate 600. In this case, the impurity ions having the identical conductive type as the well are implanted.

Figure 5D:
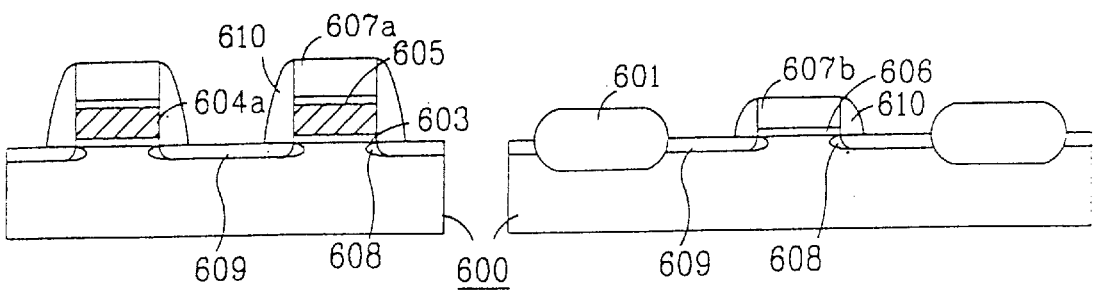

Thereafter, as shown in FIG. 5D, sidewall spacers 610 are respectively formed at both side walls of the control gate electrode 607*a* of the memory cell unit and the gate electrode 607*b* of the peripheral circuit unit. The sidewall spacer 610 is formed by forming a silicon oxide film or a silicon nitride film on an entire resultant structure of FIG. 5C, and by performing an anisotropic etching thereon.

Figure 5E:
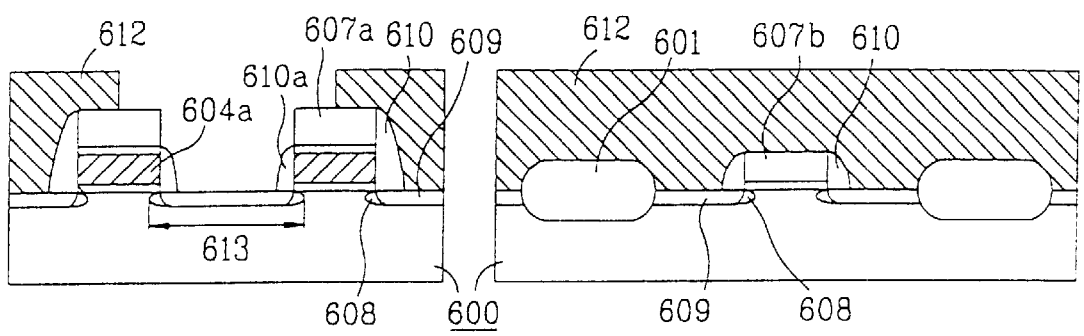

As illustrated in FIG. 5E, in order to commonly connect the sources, a common source mask 612 is formed on the entire upper surface of the semiconductor substrate 600 except for a common source region 613.

The field oxide film (not shown) dividing the sources of each memory cell is etched by using the common source mask 612 in order to form a common source. Here, the sidewall spacers 610 adjacent to the common source region 613 are also etched during the etching process. As indicated by reference numeral 610*a,* a size (width) of the sidewall spacer is considerably decreased, and thus it remains only at the side wall of the floating gate electrode 604*a.*

Figure 5F:
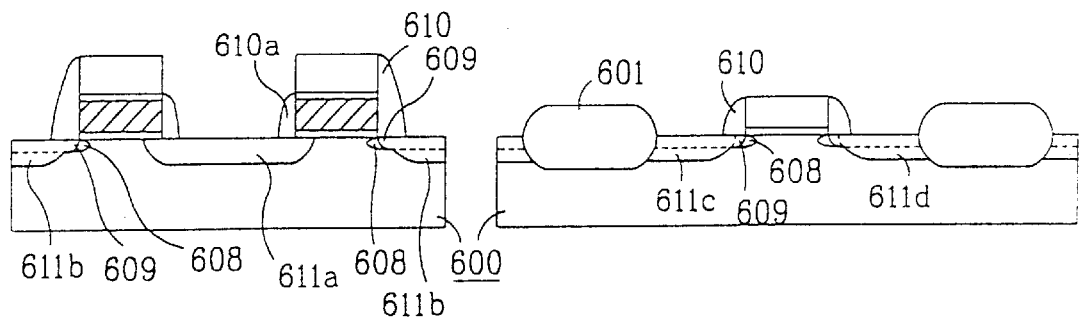

Referring to FIG. 5F, the common source mask 612 is removed. The first conductive type impurity ions, more concentrated than the lightly-doped layer 609 by 100 times, are implanted into the semiconductor substrate 600 by using the sidewall spacers 610, 610*a* as masks, and a thermal process is carried out thereon, thereby forming highly-doped layers 611*a,* 611*b,* 611*c,* 611*d.* Here, the highly-doped layers 611*a,* 611*b,* 611*c,* 611*d* are the source 611*a* and drain 611*b* of the memory cell transistor and the source 611*c* and drain 611*d* of the peripheral circuit unit transistor. The sources and drains 611*a,* 611*b,* 611*c,* 611*d* of the memory cell unit and the peripheral circuit unit are formed according an identical ion implantation process.

As illustrated in FIG. 5F, the drain 611*b* of the memory cell unit and the source 611*c* and drain 611*d* of the peripheral circuit unit have a structure having the lightly-doped layer 609, namely the LDD region therearound, and forming the halo ion implantation layer around the lightly-doped layer 609. However, the source 611*a* of the memory cell unit consists of a single junction structure having the highly-doped layer 611*a*. In forming the common source region, the sidewall spacers 610 adjacent to the common source region are etched, and mostly removed when the field oxide film is removed. Accordingly, the highly doped impurity ions implanted into the common source region are laterally diffused toward a lower portion of the gate electrode by the succeeding thermal process, and thus surround the halo ion implantation layer and the lightly-doped layer. As a result, the common source regions become the highly-doped regions.

In addition, the source 611*a* and the floating gate electrode 604*a* are sufficiently overlapped by the lateral diffusion. On the other hand, there remains the sidewall spacers adjacent to the drain of the memory cell and positioned at the both sides of the gate electrode of the peripheral circuit unit. Thus, even if the impurity ions are highly doped and the thermal process is carried out thereon, they are not sufficiently laterally diffused toward the lower portion of the gate electrode to surround the halo ion implantation layer. Accordingly, the drain of the memory cell unit has a halo-LDD structure which can improve programming efficiency. In addition, the source region can improve erase efficiency because it obtains a sufficient overlapping area with the floating gate electrode.

Figure 6:
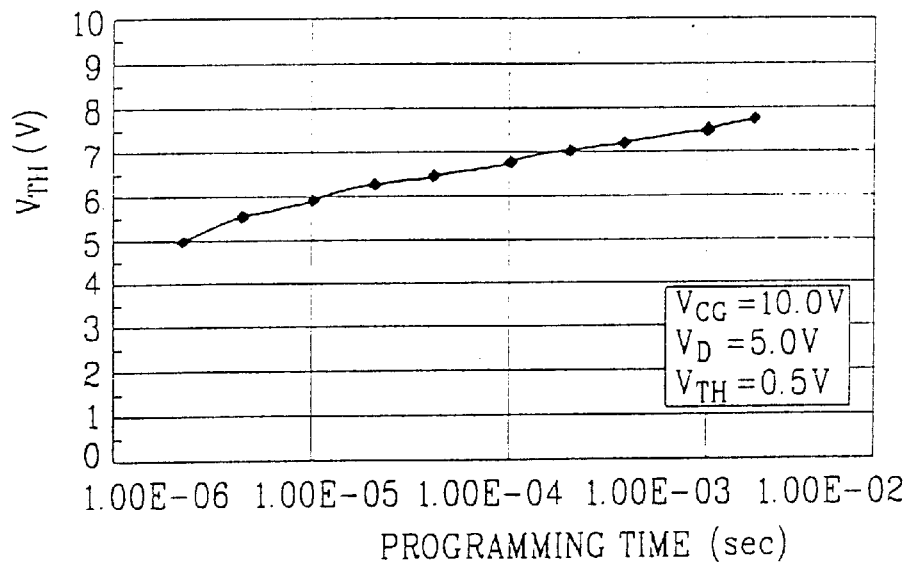
FIG. 6 is a graph showing a program property of the semiconductor device in accordance with the present invention, namely a variation of a threshold voltage value in relation to a program time.
Figure 8:
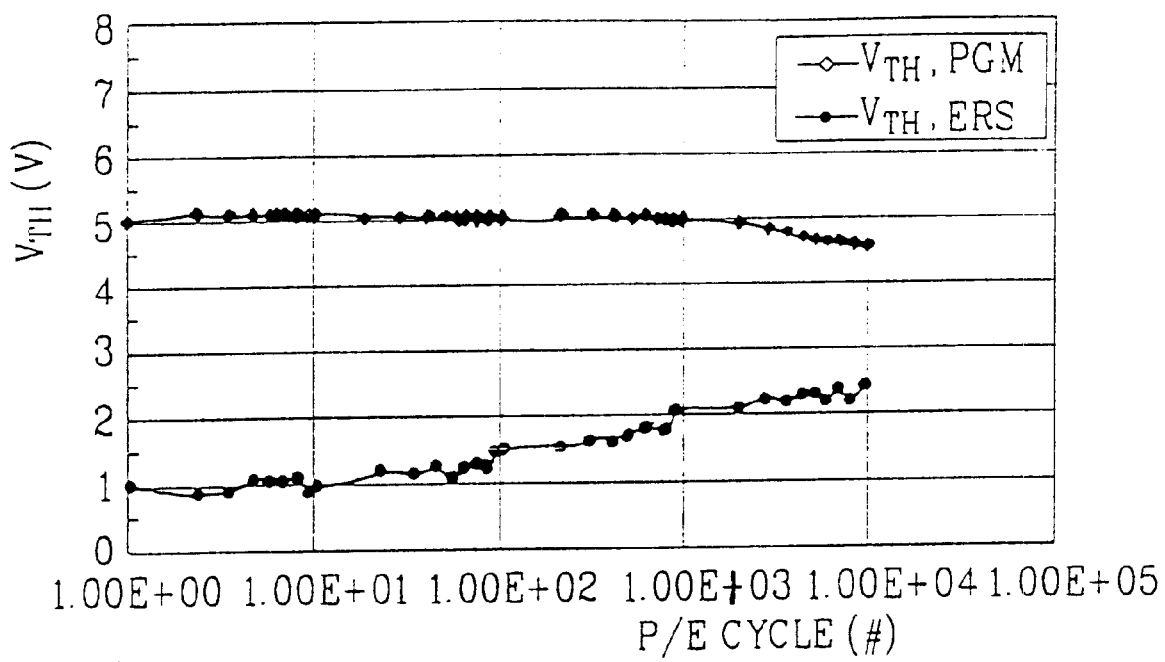
FIG. 8 is a graph showing reliability of the semiconductor device in accordance with the present invention, namely variations of the threshold voltage value in program and erase operations in relation to the number of the program and erase operations.

FIG. 6 is a graph showing a programming property of the semiconductor memory device in accordance with the present invention. Before the programming operation is performed, a threshold voltage Vth of the memory device is 0.5V. FIG. 8 shows a variation of the threshold voltage when a voltage of 10V is applied to the control gate electrode, a voltage of 5V is applied to the drain, and program time is increased by 2 $\mu$s. When the threshold voltage value of the programmed cell is set to be 5V, the program is finished within approximately 2 $\mu$s, thus showing a superior program property.

Figure 7:
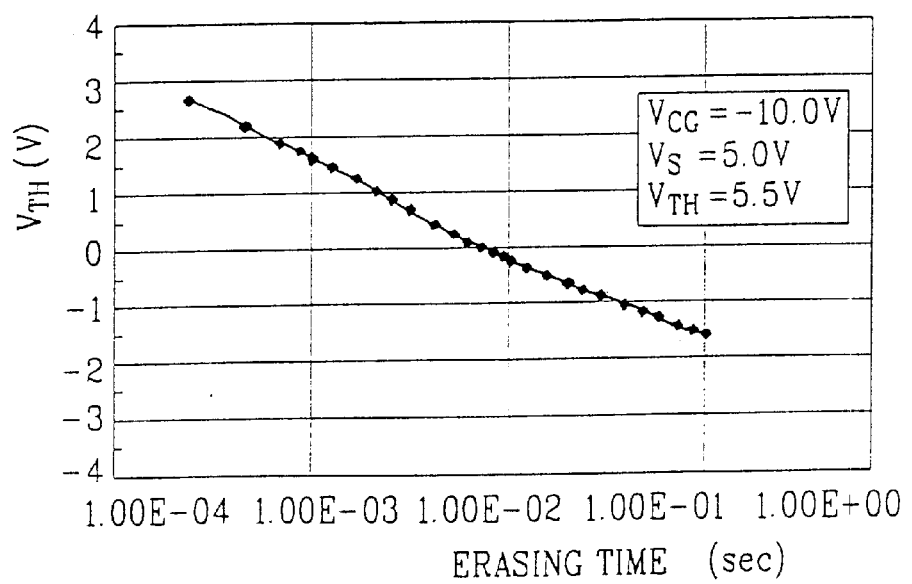
FIG. 7 is a graph showing an erase property of the semiconductor device in accordance with the present invention, namely a variation of the threshold voltage value in relation to an erase time.

FIG. 7 is a graph illustrating a variation of the threshold voltage by an erase time when the programmed memory cell is erased. Here, the threshold voltage before the erase operation is 5.5V, a voltage of −10V is applied to the control gate electrode, and a voltage of 5V is applied to the source. As shown therein, the threshold voltage value becomes less than 2.5V within approximately 200 $\mu$s, thereby showing a superior erase property.

FIG. 8 is a graph illustrating a variation value of the threshold voltage according to the number of repeated program and erase operations. Here, the program time and the erase time are set to be 2 s and 2 $\mu$s, respectively. As shown therein, when the number of the program and erase operations reaches 1000, the threshold voltage value is rarely varied during the program and erase operations. Even in the 1000th program/erase operation, the threshold voltage value is only slightly varied. Accordingly, at least 1000 program and erase operations have sufficient reliability.

In accordance with the present invention, the drain of the memory cell unit of the flash memory device has the LDD and halo ion implantation structure, thereby improving the programming property. In addition, its structure becomes identical to the structure of the source and drain of the peripheral circuit unit transistor, thereby simplifying the manufacturing process. As a result, the ion implantation process is not separately performed in order to form the sources and drains of the peripheral circuit unit and the memory cell unit, thus omitting a photo lithography process. Therefore, the fabrication period and cost of the semiconductor device are reduced.

Furthermore, the source structure of the memory cell unit of the flash memory cell device in accordance with the present invention is the abrupt junction structure, and thus an area of the memory cell is decreased, as compared with the graded junction structure. Thus, productivity of the semiconductor device is improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such metes and bounds are therefore intended to be embraced by the appended claims.

What is claimed is:

1. A method of fabricating a semiconductor substrate, comprising:

forming a first gate structure for a memory cell having a floating gate electrode and a control gate with an interpoly dielectric layer interposed therebetween and simultaneously forming a second gate structure for a peripheral circuit having a gate electrode absent a control gate;

forming sidewall spacers at respective sides of the first and second gate structures;

forming a common source mask to expose a common source region of the memory cell;

partially etching the sidewall spacer of the first gate structure adjacent to the common source region using the common source mask;

forming a region of a first conductive type in the common source region by using the first and second gate structures and the sidewall spacers as masks.

2. The method according to claim 1, further comprising:

implanting impurity ions of the first conductive type into the semiconductor substrate at a relatively low doping concentration adjacent to the first and second gate structures, thereby forming a lightly-doped region; and implanting halo ions of a second conductive type adjacent to the lightly-doped region, and wherein the forming step implants ions of the first type with a relatively high concentration into the lightly-doped region to convert a portion of the lightly-doped region into a highly-doped region.

3. The method according to claim 2, wherein the step for implanting halo ions of a second conductive type includes implanting the halo ions at a slope angle.

4. The method according to claim 3, wherein a slope angle is approximately 30°.

5. The method according to claim 2, wherein the steps for implanting impurity ions of a first conductive type include implanting phosphorus or arsenic ions.

6. A method of fabricating a semiconductor substrate, comprising:

forming a first gate structure for a memory cell having a floating gate electrode and a control gate with an interpoly dielectric layer interposed therebetween and simultaneously forming a second gate structure for a peripheral circuit having a gate electrode absent a control gate;

forming a first region of a first conductive type in the semiconductor substrate at respective sides of the first and second gate structures;

forming a second region of the first conductive type in the semiconductor substrate adjacent sides of the first region further from the first and second gate structures; and forming a halo ion region of a second conductive type, opposite the first conductive type, adjacent to sides of the first region and nearer to the first and second gate structures.

7. The method according to claim 6, wherein the step for forming a halo ion region includes implanting halo ions at a slope angle.

8. The method according to claim 7, wherein a slope angle is approximately 30°.

9. The method according to claim 6, wherein the steps for forming the first and second regions include implanting phosphorus or arsenic ions.

10. The method according to claim 6, wherein the forming a second region step includes implanting ions of the first conductive type with a relatively high concentration into the first region to convert a portion of the first region into a highly-doped region.

* * * * *

UNITED STATES PATENT AND TRADEMARK OFFICE
CERTIFICATE OF CORRECTION

PATENT NO.     : 6,479,346 B1
DATED          : November 12, 2002
INVENTOR(S)    : Sang-Bai Yi et al.

It is certified that error appears in the above-identified patent and that said Letters Patent is hereby corrected as shown below:

<u>Title page,</u>
Item [73], change the Assignee from "LG Semicon Co., Ltd." to -- Hyundai Electronics Industries Co., Ltd. --

Signed and Sealed this

Seventeenth Day of June, 2003

JAMES E. ROGAN
*Director of the United States Patent and Trademark Office*